(12) United States Patent
Chien et al.

(10) Patent No.: US 10,309,986 B2
(45) Date of Patent: Jun. 4, 2019

(54) TEMPERATURE-CONTROLLED MODULE FOR ELECTRONIC DEVICES AND TESTING APPARATUS PROVIDED WITH THE SAME

(71) Applicant: CHROMA ATE INC., Taoyuan (TW)

(72) Inventors: Chia-Hung Chien, Taoyuan (TW); Xin-Yi Wu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 72 days.

(21) Appl. No.: 15/628,069

(22) Filed: Jun. 20, 2017

(65) Prior Publication Data

US 2018/0024162 A1 Jan. 25, 2018

(30) Foreign Application Priority Data

Jul. 22, 2016 (TW) .............................. 105123233 A

(51) Int. Cl.
*G01R 1/04* (2006.01)
*G01R 31/28* (2006.01)
(Continued)

(52) U.S. Cl.
CPC ....... *G01R 1/0458* (2013.01); *G01R 31/2891* (2013.01); *G05D 23/1919* (2013.01); *G01R 1/44* (2013.01); *G05D 23/24* (2013.01)

(58) Field of Classification Search
CPC ............ G01R 31/2891; G01R 31/2875; G01R 31/2863; G01R 1/0408; G01R 1/0458; G01R 1/0491; G01R 31/2855; G01R 31/2868; G01R 31/2874; G01R 31/2893; G01R 31/311; G01R 31/2851; G01R 31/2877; G01R 31/30; G01R 29/0814; G01R 31/2862; G01R 33/3856;
(Continued)

(56) References Cited

U.S. PATENT DOCUMENTS 6,191,599 B1 * 2/2001 Stevens .............. G01R 31/2862
324/750.07
6,384,593 B1 * 5/2002 Kobayashi ......... G01R 31/2868
324/750.05
(Continued)

*Primary Examiner* — Vinh P Nguyen
(74) *Attorney, Agent, or Firm* — Muncy, Geissler, Olds & Lowe, P.C.

(57) ABSTRACT

A temperature-controlled module for electronic devices and a testing apparatus provided with the same mainly include a temperature-controlled tray, an upper board and a dry-air supply device. The temperature-controlled tray includes holding cavities for accommodating electronic devices and a fluid chamber for cooling fluid. The upper board is furnished with through holes, while the upper board and the temperature-controlled tray are spaced by a predetermined distance. The dry-air supply device provides dry air to a space between the temperature-controlled tray and the upper board. Thereupon, by having cooling fluid to flow inside the temperature-controlled tray, the temperature-controlled tray can be kept in a lower predetermined temperature so as to rapidly cool down the electronic device. In addition, by providing the upper board and the dry-air supply device to allow dry air to flow through the surface of the electronic device, then the water-condensation phenomenon and air leakage can avoided.

16 Claims, 6 Drawing Sheets

(51) Int. Cl.
*G05D 23/19* (2006.01)
*G01R 1/44* (2006.01)
*G05D 23/24* (2006.01)

(58) Field of Classification Search
CPC .... G01R 1/0433; G01R 31/00; G01R 31/003;
G01R 31/2817; G01R 33/3403; G01R
35/00; G01N 33/48707; G01N 15/1404;
G01N 2015/1409; G01N 2035/00346;
G05D 23/1928; G05D 23/1934; G05D
23/24
See application file for complete search history.

(56) References Cited

U.S. PATENT DOCUMENTS

| 8,704,542 B2* | 4/2014 | Tiengtum | G01R 1/0458 |
| | | | 324/750.03 |
| 2004/0032275 A1* | 2/2004 | Cader | G01R 1/0458 |
| | | | 324/750.08 |

* cited by examiner

TEMPERATURE-CONTROLLED MODULE FOR ELECTRONIC DEVICES AND TESTING APPARATUS PROVIDED WITH THE SAME

This application claims the benefit of Taiwan Patent Application Serial No. 105123233, filed Jul. 22, 2016, the subject matter of which is incorporated herein by reference.

BACKGROUND OF INVENTION

1. Field of the Invention

The invention relates to a temperature-controlled module for electronic devices and a testing apparatus provided with the same, and more particularly to the temperature-controlled module for electronic devices and the testing apparatus provided with the temperature-controlled module that can be applied to cool down to the electronic devices and can also carry out a low-temperature testing.

2. Description of the Prior Art

Prior to shipments of electronic devices, in order to examine if a specific electronic device can work normally under severe environments, both high-temperature and low-temperature testing are usually applied. In addition, by having the low-temperature testing for example, the electronic device to be tested shall be lowered to a predetermined temperature in advance, −20° C. for instance. Then, it can be carried on to determine if or not the electronic device can work normally Nevertheless, the low-temperature testing can be largely classified into two types as follows. One of these two types is to lower the temperature of the electronic device directly on the testing platform, and then to carry out the testing. Such a type of testing would take a longer testing time, since a wait time for the electronic device to be lowered to the desired temperature is necessary. Also, the design of the testing platform as well as the press-contact device is much more complicated, due that elements for adjusting and detecting the temperature are required.

On the other hand, another type of low-temperature testing is that the testing apparatus defines a low-temperature zone for resting the electronic device to be tested to lower its temperature to a predetermined low temperature. As long as the temperature of the electronic device is lowered to the predetermined low temperature in the low-temperature zone, then the electronic device is moved to the testing platform for further testing. However, such a type of testing can provide high testing efficiency, need no waiting time for the electronic device to be lowered to the desired temperature, and perform non-stop testing.

However, even that the electronic device is kept in a low-temperature zone, it is still in a state of exposing to the atmosphere, and thus occasional condensation of moisture on the electronic device in a low-temperature environment is definitely inevitable. Namely, it is natural that some condensed water on the electronic device might be always possible. Further, as long as the condensed water touches circuits of the testing apparatus, for example contacting ports or circuits on to the testing platform, then a risk of short circuit does exist.

In view of modern art, a resort of injecting dry air into the low-temperature zone is usually applied. Thereupon, even that the electronic device is in a low-temperature environment, the condensation of moisture thereon would be effectively inhibited. In addition, in order to prevent the low-temperature air and the injected dry air in the low-temperature zone from dissipation, a seal chamber or an anti-leakage mechanism is usually introduced, such as an air curtain. However, the introduction of the seal chamber or the air curtain would cause problems in space arrangement, shipment flow, testing efficiency, and/or costing of the entire testing apparatus.

SUMMARY OF THE INVENTION

Accordingly, it is the primary object of the present invention to provide a temperature-controlled module for electronic devices and a testing apparatus provided with the same, so as to lower the temperature of the electronic device to be tested with better efficiency and acceptable cost. Also, the surface condensation of the electronic device can be effectively inhibited. In comparison with the prior art, the present invention can provide significant improvement on space arrangement, shipment flow, and/or testing efficiency.

In an embodiment, the temperature-controlled module of electronic device mainly includes a temperature-controlled tray, an upper board and dry-air supply device. The temperature-controlled tray includes at least one electronic-device holding cavity and a fluid chamber, in which the at least one electronic-device holding cavity is to contain at least one electronic device, and the fluid chamber for receiving a cooling fluid is located inside the temperature-controlled tray. The upper board, furnished with at least one through hole, is located aside to the temperature-controlled tray. A predetermined distance is formed between the upper board and the temperature-controlled tray. The at least one through hole is respective to the at least one electronic-device holding cavity of the temperature-controlled tray. The dry-air supply device is to provide a dry air to a space between the temperature-controlled tray and the upper board.

In another embodiment, a temperature-controlled module of electronic device mainly includes a base board, an electronic-device carrier assembly and a dry-air supply device. The base board includes a fluid route coupled with a cooling-fluid source. The electronic-device carrier assembly is laid over the base board. The electronic-device carrier assembly includes at least one electronic-device holding cavity and at least one through hole, in which at least one electronic-device holding cavity is respective to the at least one through hole, and spaced from another by a dry-air flowing space. In addition, the dry-air supply device supplies a dry air to the dry-air flowing space.

In another embodiment, an apparatus for testing a temperature-controlled module of electronic device mainly includes a material-inlet zone, a temperature-controlled zone, a testing zone, a material-outlet zone, and at least one shipment device. The material-inlet zone is to accommodate an electronic device. The temperature-controlled zone is to use a temperature-controlled module of the electronic device to lower a temperature of the electronic device to a specific temperature, in which the temperature-controlled module of electronic device includes a temperature-controlled tray, an electronic-device carrier assembly and a dry-air supply device. The temperature-controlled tray is to receive a cooling fluid, and the dry-air supply device is to provide a dry air to the electronic-device carrier assembly. The testing zone is to test the electronic device with a temperature already being lowered to a specific temperature. The material-outlet zone is to accommodate the electronic device already being examined (called as the examined electronic device). The at least one shipment device is to convey the electronic device around the material-inlet zone, the temperature-controlled zone, the testing zone and the material-outlet zone.

All these objects are achieved by the temperature-controlled module for electronic devices and the testing apparatus provided with the same described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a temperature-controlled module for electronic devices and a testing apparatus provided with the same. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Prior to explain embodiments of the temperature-controlled module for electronic devices and a testing apparatus provided with the same in accordance with the present invention, it shall be noted that, in the following description, similar elements would be assigned with the same number. Further, drawings of the present invention are used for clearly explaining the embodiments only, and thus are neither prepared proportionally nor provided all the details.

Figure 1:
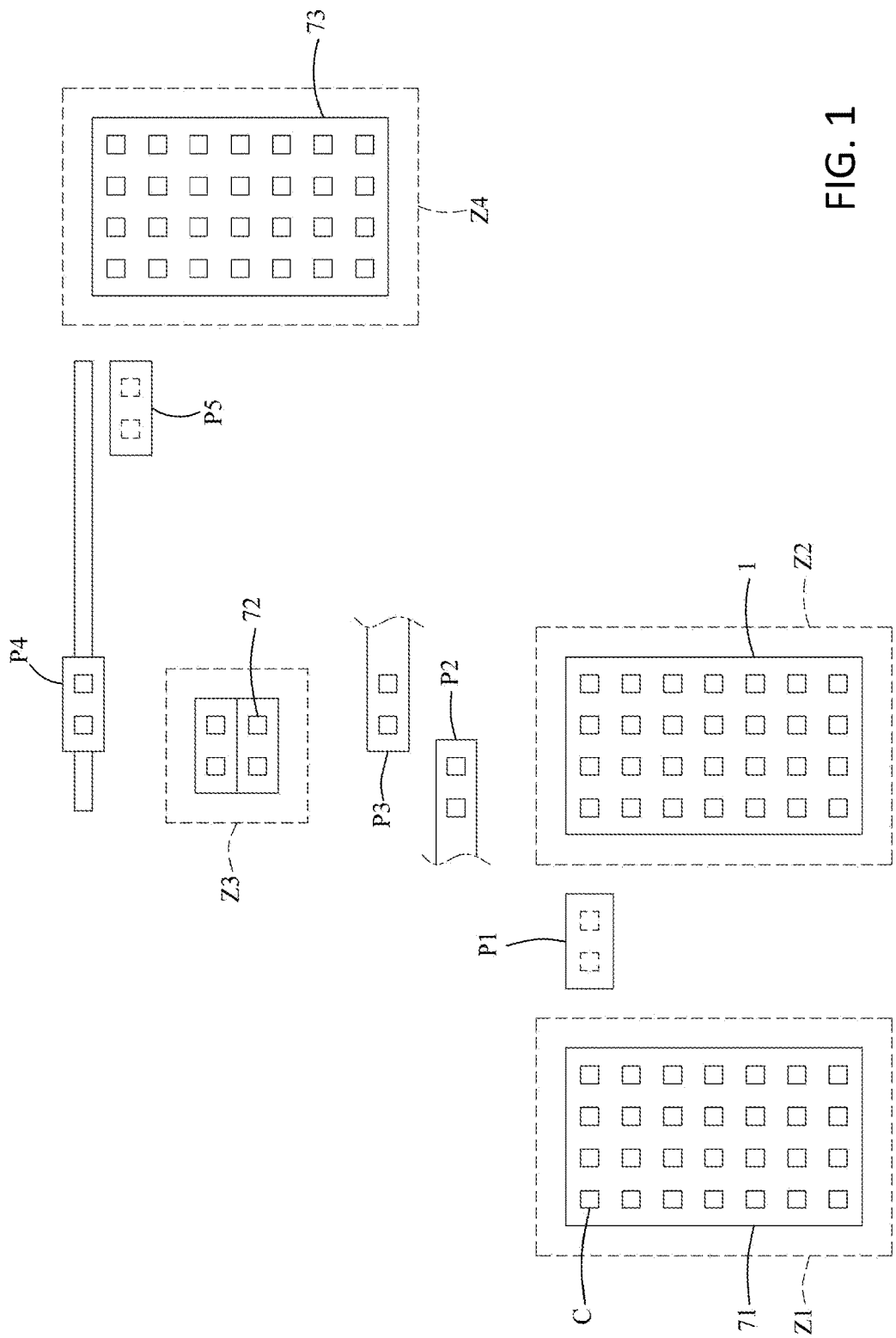
FIG. 1 is a schematic view of a preferred embodiment of the testing apparatus provided with the temperature-controlled module for electronic devices in accordance with the present invention.

Referring now to FIG. 1, a schematic view of a preferred embodiment of the testing apparatus provided with the temperature-controlled module for electronic devices in accordance with the present invention is shown. In this embodiment, the testing apparatus mainly includes a material-inlet zone Z1, a temperature-controlled zone Z2, a testing zone Z3, a material-outlet zone Z4, and five shipment devices P1~P5. The material-inlet zone Z1 for accommodating electronic devices C to be tested may include or be directly formed as a general chip tray 71. In addition, the temperature-controlled zone Z2 includes a temperature-controlled module of electronic device 1 for lowering a temperature of the electronic device C to a specific temperature.

Further, the shipment device P1 can be a general pick-and-place device for transporting the electronic device C. Namely, the shipment device P1 can transport the electronic device C to be tested from the chip tray 71 in the material-inlet zone Z1 to the temperature-controlled module of electronic device 1 in the temperature-controlled zone Z2. Here, the temperature-controlled module of electronic device 1 is to lower the temperature of the electronic device C to a specific temperature.

Refer back to discuss the testing zone Z3 and the shipment devices P2, P3, P4 as shown in FIG. 1. The testing zone Z3 includes a testing platform 72 for examining the electronic device C. In addition, the shipment devices P2, P3 can be normal robots that can convey alternately the electronic devices C around the temperature-controlled zone Z2, the testing zone Z3, and the shipment device P4. The shipment device P4, on the other hand, can be a shuttle. In the present invention, the shipment devices P2, P3, P4 are all used to convey the electronic devices C. However, in some other embodiments of the present invention, an additional shuttle can be added to travel between the temperature-controlled zone Z2 and the testing zone Z3. Further, on this shuttle, a temperature-controlled module can be included, though not shown in the figure. The temperature-controlled module on this shuttle is mainly used to ensure that the testing temperature around the electronic device C conveyed between the temperature-controlled zone Z2 and the testing zone Z3 can be preserved, and thereupon temperature drop won't occur during the conveying process.

In this embodiment, the shipment devices P2, P3 are used to transport the electronic devices C around the temperature-controlled module of electronic device 1 in temperature-controlled zone Z2, the testing platform 72 in the testing zone Z3, and the shipment device P4. Namely, the shipment devices P2, P3 would replace the electronic device C on the temperature-controlled module of electronic device 1 that its own temperature thereof has been lowered to the predetermined to the testing platform 72. Then, the electronic device C would be tested on the testing platform 72. While all the testing are over, the shipment devices P2, P3 would move the examined electronic device C back to the shipment device P4.

Further, in FIG. 1, a material-outlet zone Z4 and a shipment device P5 are also shown. The material-outlet zone Z4 includes a chip tray 73 for collecting the examined electronic devices C, and the shipment device P5 is an ordinary pick-and-place device that can be used to convey the electronic devices C between the shipment device P4 and the chip tray 73 in the material-outlet zone Z4. Namely, after the examined electronic device C is transported to the shipment device P4, the shipment device P4 would move toward the material-outlet zone Z4. As such a movement reaches the predetermined position, the shipment device P5 would fetch the electronic device C from the shipment device P4, and then displace the electronic device C onto the chip tray 73 in the material-outlet zone Z4. In addition, in some other embodiments of the present invention, the testing zone Z3 and the material-outlet zone Z4 can further include a temperature-returning device (not shown in the figure) mainly for having the examined electronic device C to gain back the temperature in advance so as not to cause notorious water-condensation phenomenon on the examined electronic device C which just experienced a low-temperature process and is now exposed to the atmosphere.

Figure 2:
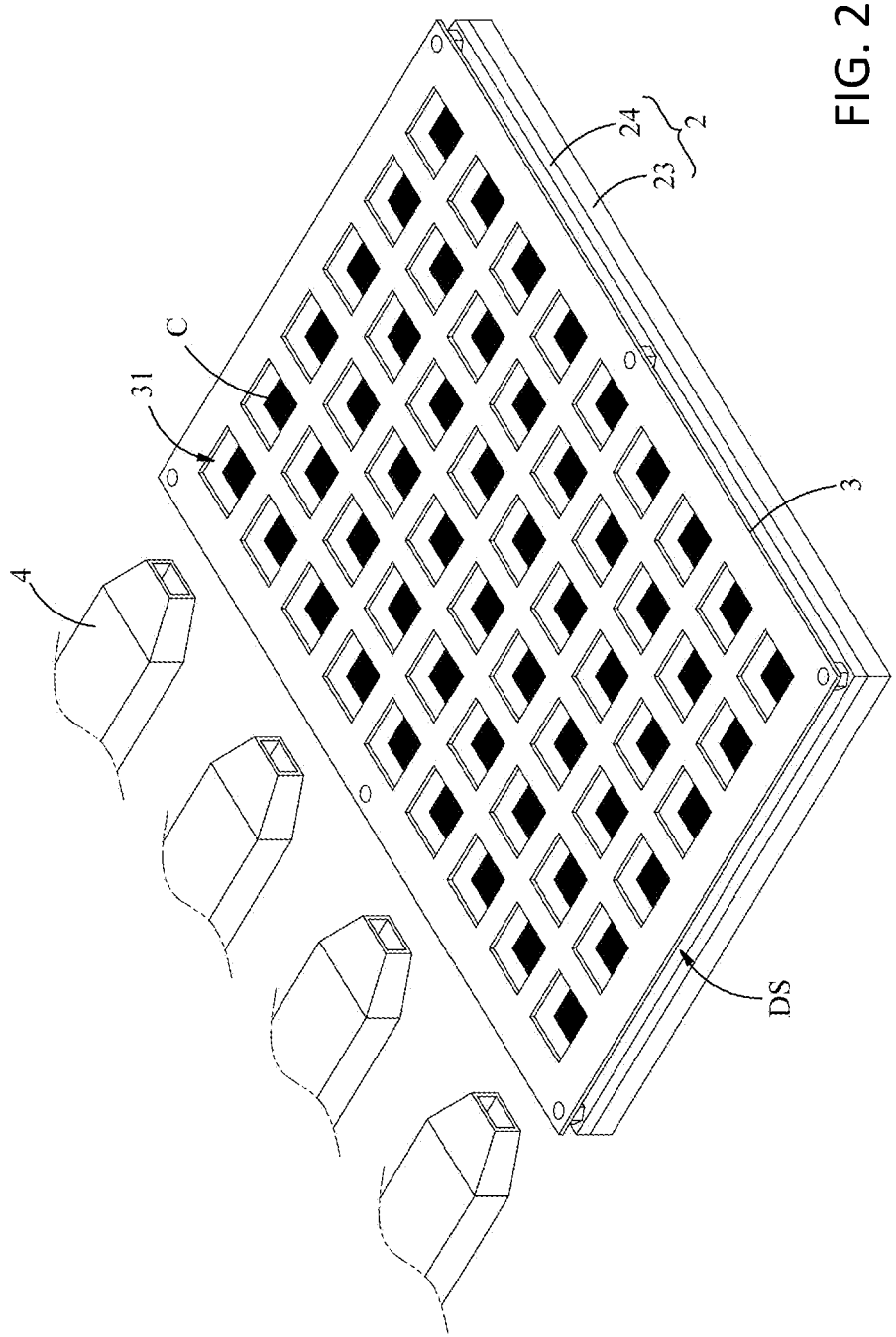
FIG. 2 is a schematic perspective view of a first embodiment of the temperature-controlled module for electronic devices in accordance with the present invention, accompanied by four dry-air supply devices.
Figure 3:
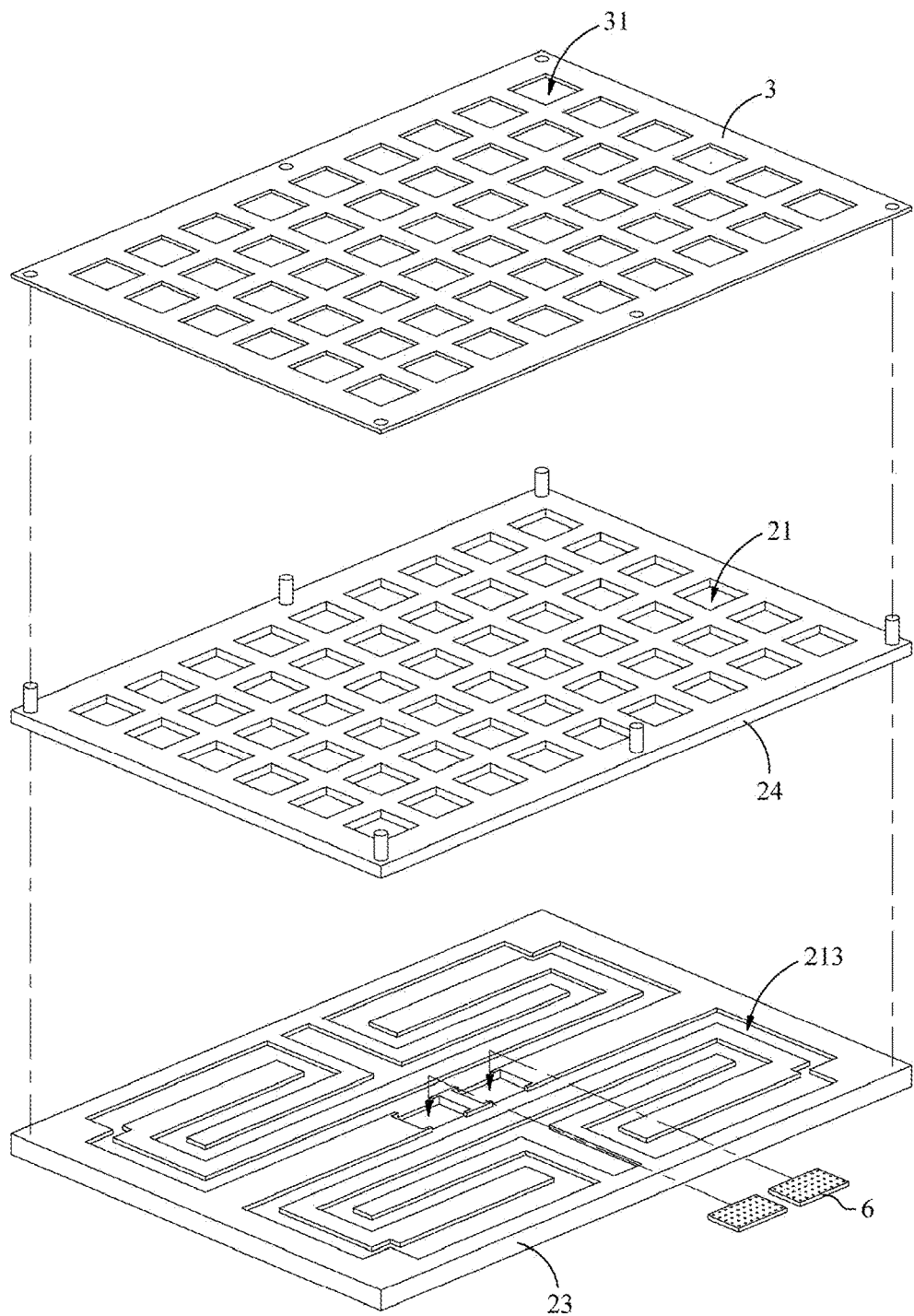
FIG. 3 is an exploded view of the first embodiment of the temperature-controlled module for electronic devices of FIG. 2.
Figure 4:
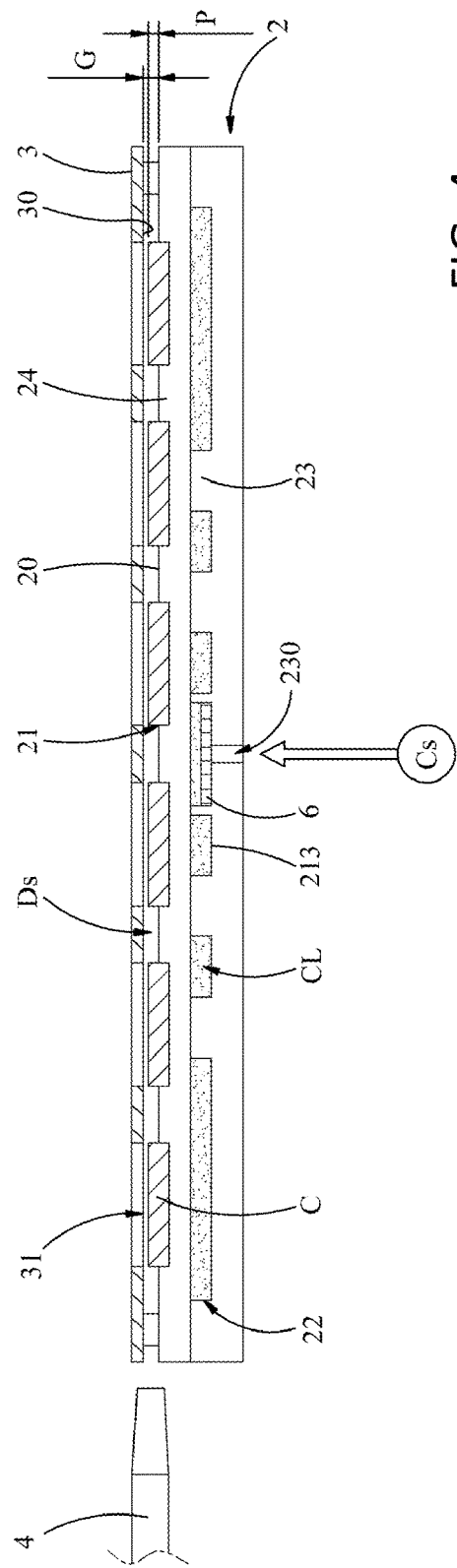
FIG. 4 is a schematic cross-sectional view of FIG. 2.

Refer now to FIG. 2, FIG. 3 and FIG. 4; where FIG. 2 is a schematic perspective view of a first embodiment of the temperature-controlled module for electronic devices in accordance with the present invention (accompanied by four dry-air supply devices), FIG. 3 is an exploded view of the first embodiment of the temperature-controlled module for electronic devices of FIG. 2, and FIG. 4 is a schematic cross-sectional view of FIG. 2.

As shown, in this embodiment, the temperature-controlled module of electronic device 1 mainly includes a temperature-controlled tray 2, an upper board 3, and a plurality of dry-air supply devices 4. The temperature-controlled tray 2 further includes a base board 23 and a holding board 24. The base board 23 is furnished thereon with a fluid inlet path 230 and a fluid route 213. The fluid inlet path 230 is connected spatially with the fluid route 213, and further connected spatially with a cooling-fluid source Cs, in which the fluid route 213 is arranged on the base board 23 in a winding manner.

In addition, as shown in this embodiment, the base board 23 of the temperature-controlled tray 2 is furnished with a fluid-diffusing plate 6 located between the fluid inlet path 230 and the fluid route 213. In particular, the fluid-diffusing plate 6 is a porous plate, for example a net plate in this embodiment. The fluid-diffusing plate 6 is provided so that, as a cooling fluid CL from the cooling-fluid source Cs enters the fluid route 213 through the fluid inlet path 230, the porosity of the fluid-diffusing plate 6 would effectively distribute the cooling fluid CL evenly so as to generate a homogeneous fluid flowing in the fluid route 213.

In addition, the holding board 24 is laid over the base board 23, and a fluid chamber 22 inside the temperature-controlled tray 2 for receiving the cooling fluid CL from the cooling-fluid source Cs is formed by the fluid inlet path 230 and the fluid route 213. The cooling fluid CL of the present embodiment can be a liquid nitrogen. Further, an upper surface 20 of the holding board 24 is provided with a plurality of electronic-device holding cavities 21 for containing the electronic devices C to be tested.

Further, the upper board 3 located upper to the temperature-controlled tray 2 is furnished thereon a plurality of through holes 31. Also, a predetermined distance G is existent between the upper board 3 and the temperature-controlled tray 2. In addition, the predetermined distance G between the upper board 3 and the temperature-controlled tray 2 is larger than the height P of the exposed portion of the electronic device C contained in the corresponding electronic-device holding cavity 21.

Further, the plurality of through holes 31 on the upper board 3 are in positions corresponding to the plurality of electronic-device holding cavities 21 of the temperature-controlled tray 2. Thereupon, the shipment device can place easily the electronic device C to be tested into the corresponding holding cavity 21 through the respective through hole 31. Further, the dry-air supply devices 4 are located aside to the temperature-controlled tray 2 and the upper board 3 so as to provide a dry air into the spaces between the temperature-controlled tray 2 and the upper board 3, i.e. the dry-air flowing space Ds.

Accordingly, in this aforesaid embodiment, the cooling fluid CL flowing inside the temperature-controlled tray 2 can keep the temperature-controlled tray 2 at a specific low temperature, such that the electronic device C rested in the respective electronic-device holding cavity 21 can be rapidly cooled down. In addition, by providing the upper board 3 and the dry-air supply device 4, the dry air can completely contact and flow over the surface of the electronic device C, such that possible water-condensation phenomenon on the electronic device C can be avoided, and the introduction of the upper board 3 can effectively prevent the dry air from free dissipation.

Figure 5:
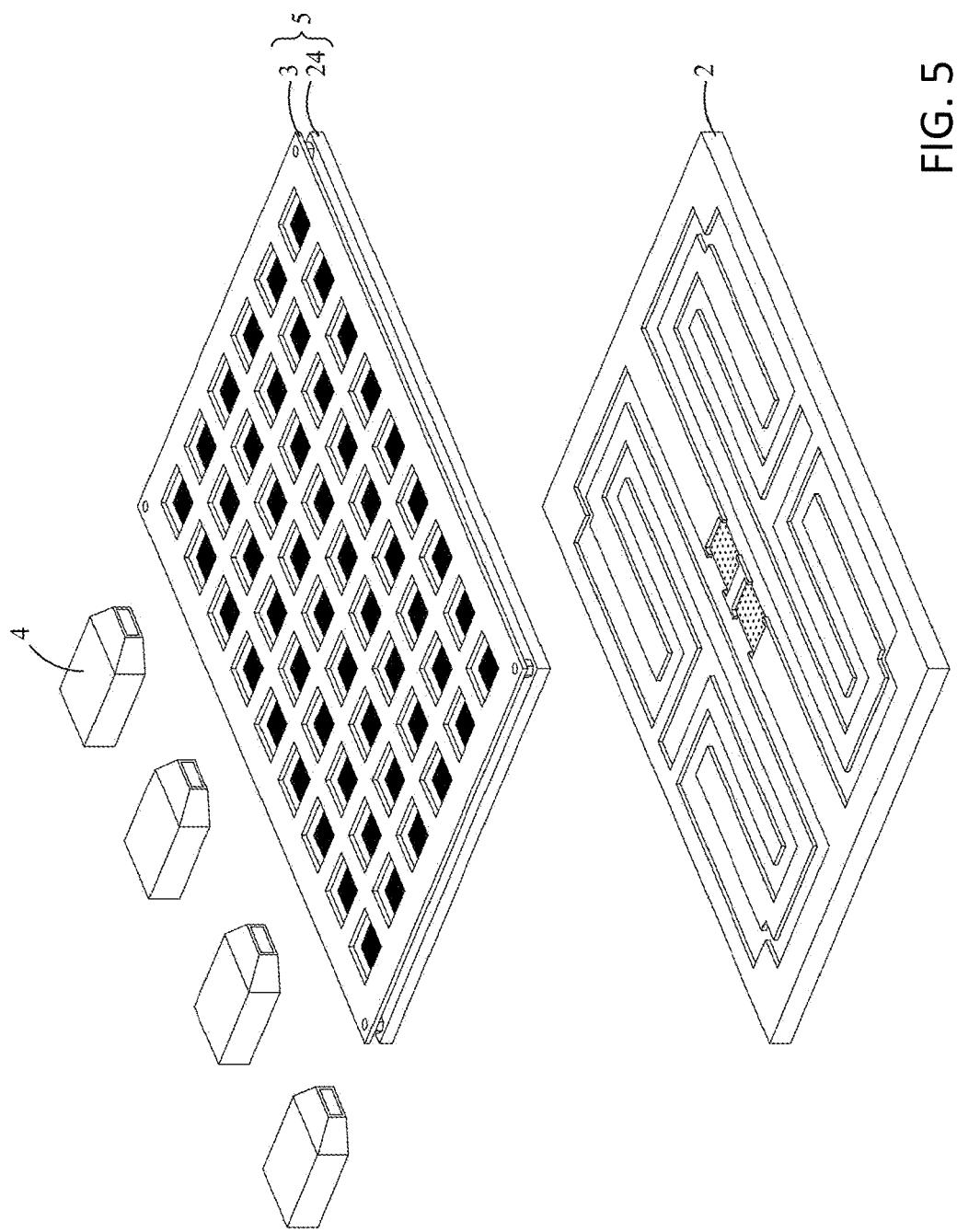
FIG. 5 is a schematic perspective view of a second embodiment of the temperature-controlled module for electronic devices in accordance with the present invention, accompanied by four dry-air supply devices.

Referring now to FIG. 5, a schematic perspective view of a second embodiment of the temperature-controlled module for electronic devices in accordance with the present invention, accompanied by four dry-air supply devices is shown. The major difference between this second embodiment and the aforesaid first embodiment is that, in this second embodiment, the holding board 24 and the upper board 3 are modular designed to form an electronic-device carrier assembly 5. Thus, in this second embodiment, the electronic-device carrier assembly 5 can be easily replaced according to different specs of electronic devices C to be tested. Namely, in this second embodiment, the electronic-device holding cavities 21 and the corresponding through holes 31 of the electronic-device carrier assembly 5 can be arbitrarily varied so as to meet any specific size or configuration of the electronic device C to be tested. Also, in the case if a requirement of changing manufacturing process or objects to be tested is met, then a replacement with a relevant electronic-device carrier assembly 5 would fulfill this change.

Figure 6:
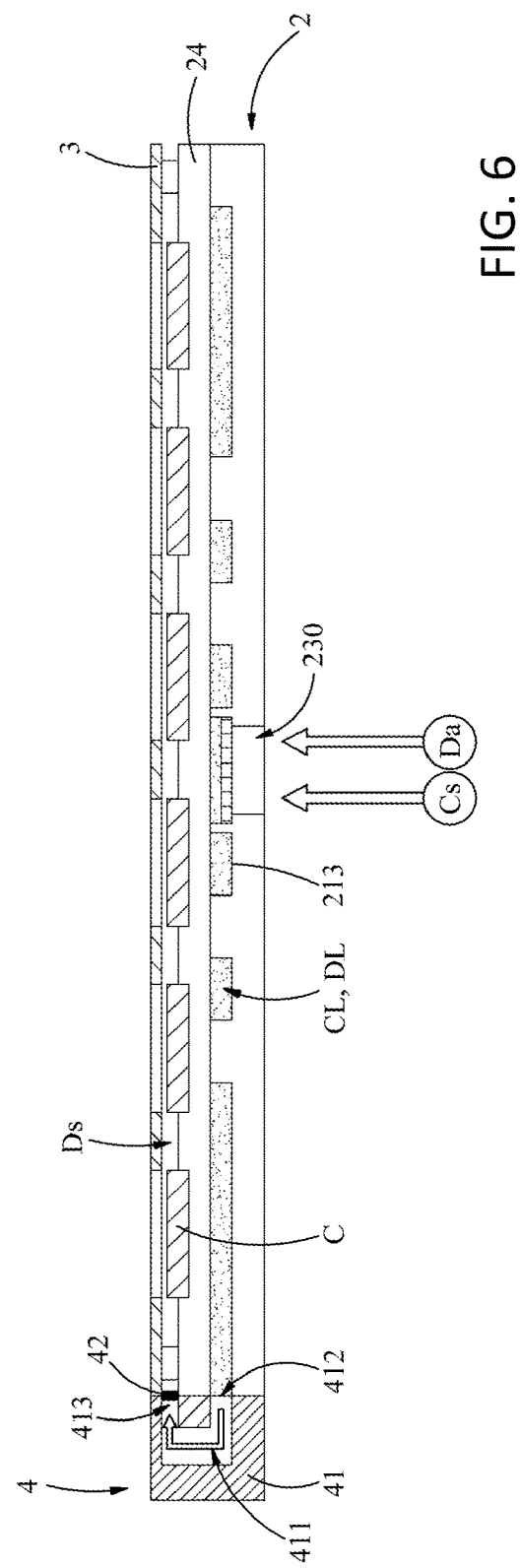
FIG. 6 is a schematic cross-sectional view of a third embodiment of the temperature-controlled module for electronic devices in accordance with the present invention, showing also a dry-air supply device.

Referring now to FIG. 6, a schematic cross-sectional view of a third embodiment of the temperature-controlled module for electronic devices in accordance with the present invention, showing also a dry-air supply device, is shown. The major difference between this third embodiment and the aforesaid two embodiments is that, in this third embodiment, the dry-air supply device 4 includes a dry-fluid source Da, an air-guide member 41 and a micro-hole plate 42. A dry air DL of the dry-fluid source Da enters the fluid route 213 via the fluid inlet path 230.

In addition, in this third embodiment, the air-guide member 41 includes a guiding route 411, and an air inlet 412 of the guiding route 411 is connected spatially with the fluid route 213, while an air outlet 413 of the guiding route 411 is connected spatially with the dry-air flowing space Ds, i.e. the space between the upper board 3 and the holding board 24. As shown, the fluid route 213 leads the dry air DL and the cooling fluid CL to the dry-air flowing space Ds. Thereupon, the dry air DL and the cool air can use the same fluid route 213, and the dry air DL and the cooling fluid CL can be led to the dry-air flowing space Ds via the air-guide member 41, such that the cooling fluid CL can further cool down the surface of the electronic device C, and the dry air DL can also prevent the surface of the electronic device C from condensation of moisture.

In addition, the micro-hole plate 42 of the present invention is mounted at the air outlet 413 of the guiding route 411. By providing a plurality of micro through holes to the micro-hole plate 42, excellent permeability of the micro-hole plate 42 can thus be formed, such that the dry air DL and the cooling fluid CL from the fluid route 213 can be completely diffused so as to be evenly dispersed in the dry-air flowing space Ds.

Further, in the present invention, the supply of the dry air DL and the cooling fluid CL can be continuously or alternately performed. That is, the dry air DL and the cooling fluid CL can be mixed in the fluid route 213 in advance before entering the dry-air flowing space Ds, or the dry air DL and the cooling fluid CL can be alternately provided to flow through the same fluid route 213 prior to entering the dry-air flowing space Ds.

While the present invention has been particularly shown and described with reference to a preferred embodiment, it will be understood by those skilled in the art that various changes in form and detail may be without departing from the spirit and scope of the present invention.

What is claimed is:

1. A temperature-controlled module of electronic device, comprising:
    a temperature-controlled tray, including a plurality of electronic-device holding cavities and a fluid chamber, the plurality of electronic-device holding cavities containing a plurality of electronic devices, the fluid chamber for receiving a cooling fluid being located inside the temperature-controlled tray;
    an upper board, furnished with a plurality of through holes, located aside to the temperature-controlled tray, a predetermined distance being formed between the upper board and the temperature-controlled tray, the plurality of through holes being respective to the plurality of electronic-device holding cavities of the temperature-controlled tray; and
    a dry-air supply device, providing a dry air to a space between the temperature-controlled tray and the upper board;
    wherein the cooling fluid is used to cool down the plurality of electronic devices, and the dry air is used to prevent the plurality of electronic devices from condensation of moisture.

2. The temperature-controlled module of electronic device of claim 1, wherein the predetermined distance between the upper board and the temperature-controlled tray is greater than or equal to a height of an exposed portion of the plurality of electronic devices contained in the plurality of electronic-device holding cavities.

3. The temperature-controlled module of electronic device of claim 1, wherein the temperature-controlled tray includes a base board and a holding board, the base board being provided with a fluid inlet path and a fluid route, the fluid inlet path being connected spatially with the fluid route and further with a cooling-fluid source, the plurality of electronic-device holding cavities being formed on the holding board; the holding board being laid over the base board, the fluid chamber being constructed by the fluid inlet path and the fluid route.

4. The temperature-controlled module of electronic device of claim 3, further including a fluid-diffusing plate located between the fluid inlet path and the fluid route, the fluid-diffusing plate being a porous plate.

5. The temperature-controlled module of electronic device of claim 3, wherein the dry-air supply device further includes a dry-fluid source and an air-guide member, the dry-fluid source providing the dry air to the fluid inlet path, the air-guide member being located aside to the temperature-controlled tray and the upper board and connected spatially with the fluid route, the air-guide member leading at least one of the dry air and the cooling fluid to a space between the temperature-controlled tray and the upper board.

6. The temperature-controlled module of electronic device of claim 5, wherein the dry-air supply device further includes a micro-hole plate, the air-guide member further includes a guiding route, an air inlet of the guiding route is connected spatially with the fluid route, and the micro-hole plate is located at an air outlet of the guiding route.

7. A temperature-controlled module of electronic device, comprising:
    a base board, including a fluid route connected spatially with a cooling-fluid source to provide a cooling fluid;
    an electronic-device carrier assembly, laid over the base board, including a plurality of electronic-device holding cavities to contain respectively a plurality of electronic devices and a plurality of through holes positioned respectively above the plurality of electronic-device cavities, a dry-air flowing space being formed between the plurality of electronic-device holding cavities and the respective plurality of through holes, the fluid route being connected spatially with the dry-air flowing space; and
    a dry-air supply device, supplying a dry air to the dry-air flowing space;
    wherein the cooling fluid is used to cool down the plurality of electronic devices, and the dry air is used to prevent the plurality of electronic devices from condensation of moisture.

8. The temperature-controlled module of electronic device of claim 7, wherein the electronic-device carrier assembly includes a holding board and an upper board, the holding board being furnished with the plurality of electronic-device holding cavities, the upper board being furnished with the plurality of through holes, the upper board and the holding board being spaced by a predetermined distance so as to from the dry-air flowing space.

9. The temperature-controlled module of electronic device of claim 7, wherein the dry-air supply device further includes a dry-fluid source and an air-guide member, the dry-fluid source providing the dry air to the fluid route, the air-guide member located aside to the electronic-device carrier assembly and being connected spatially with the fluid route, the air-guide member being to lead at least one of the dry air and the cooling fluid to the dry-air flowing space.

10. The temperature-controlled module of electronic device of claim 9, wherein the dry-air supply device further includes a micro-hole plate, the air-guide member further includes a guiding route, an air inlet of the guiding route is connected spatially with the fluid route, and the micro-hole plate is located at an air outlet of the guiding route.

11. A testing apparatus, comprising:
    a material-inlet zone, being to accommodate a plurality of electronic devices;
    a temperature-controlled zone, being to use a temperature-controlled module to lower temperatures of the plurality of electronic devices to a specific temperature, the temperature-controlled module including a temperature-controlled tray, an electronic-device carrier assembly and a dry-air supply device, the temperature-controlled tray being to receive a cooling fluid, the dry-air supply device being to provide a dry air to the electronic-device carrier assembly;
    a testing zone, being to test the plurality of electronic devices that the temperatures thereof have been lowered to a specific temperature;
    a material-outlet zone, being to accommodate the plurality of electronic devices that have been already examined (called as the examined electronic devices); and
    at least one shipment device, being to convey the plurality of electronic devices around the material-inlet zone, the temperature-controlled zone, the testing zone and the material-outlet zone;
    wherein the cooling fluid is used to cool down the plurality of electronic devices, and the dry air is used to prevent the plurality of electronic devices from condensation of moisture.

12. The testing apparatus of claim 11, wherein the temperature-controlled tray includes a base board furnished with a fluid inlet path and a fluid route, the fluid inlet path being connected spatially with the fluid route so as to connect spatially a cooling-fluid source.

13. The testing apparatus of claim 12, further including a fluid-diffusing plate located between the fluid inlet path and the fluid route, the fluid-diffusing plate being a porous plate.

14. The testing apparatus of claim 12, wherein the electronic-device carrier assembly further includes a holding board and an upper board, the holding board being furnished with a plurality of electronic-device holding cavities, the upper board being furnished with a plurality of through holes, the upper board and the holding board being spaced by a predetermined distance so as to form a dry-air flowing space.

15. The testing apparatus, of claim 14, wherein the dry-air supply device further includes a dry-fluid source and an air-guide member, the dry-fluid source providing the dry air to the fluid route, the air-guide member being located aside to the electronic-device carrier assembly and connected spatially with the fluid route, the air-guide member being to lead at least one of the dry air and the cooling fluid to the dry-air flowing space.

16. The testing apparatus of claim 15, wherein the dry-air supply device further includes a micro-hole plate, the air-guide member further includes a guiding route, an air inlet of the guiding route is connected spatially with the fluid route, and the micro-hole plate is located at an air outlet of the guiding route.

\* \* \* \* \*